(12) United States Patent
Kim (10) Patent No.: US 6,693,026 B2
(45) Date of Patent: Feb. 17, 2004

(54) SEMICONDUCTOR DEVICE AND METHOD FOR FABRICATING THE SAME

(75) Inventor: Dong Chan Kim, Kyonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 3 days.

(21) Appl. No.: 09/904,094

(22) Filed: Jul. 13, 2001

(65) Prior Publication Data

US 2002/0022355 A1 Feb. 21, 2002

(30) Foreign Application Priority Data

Aug. 1, 2000 (KR) ........................................ 2000-44643

(51) Int. Cl.$^7$ .......................................... H01L 21/3205
(52) U.S. Cl. ....................................................... 438/589
(58) Field of Search .................................. 438/443, 589, 438/300, 305, FOR 188, FOR 193

(56) References Cited

U.S. PATENT DOCUMENTS

| | | | | |
|---|---|---|---|---|
| 5,270,257 A | * | 12/1993 | Shin | 257/244 |
| 5,302,551 A | * | 4/1994 | Iranmanesh et al. | 438/633 |
| 5,342,796 A | * | 8/1994 | Ahn et al. | 438/301 |
| 5,583,064 A | * | 12/1996 | Lee et al. | 438/300 |
| 5,610,091 A | * | 3/1997 | Cho | 438/259 |
| 5,736,435 A | * | 4/1998 | Venkatesan et al. | 438/151 |
| 5,874,353 A | | 2/1999 | Lin et al. | |
| 5,899,742 A | | 5/1999 | Sun | |
| 5,918,134 A | * | 6/1999 | Gardner et al. | 438/305 |
| 5,960,289 A | | 9/1999 | Tsui et al. | |
| 5,985,725 A | | 11/1999 | Chou | |
| 6,066,526 A | | 5/2000 | Hakey et al. | |
| 6,177,336 B1 | * | 1/2001 | Lin et al. | 438/305 |
| 6,200,865 B1 | * | 3/2001 | Gardner et al. | 438/197 |
| 6,303,448 B1 | * | 10/2001 | Chang et al. | 438/300 |
| 6,436,765 B1 | * | 8/2002 | Liou et al. | |
| 2001/0033000 A1 | * | 10/2001 | Mistry | 257/339 |

FOREIGN PATENT DOCUMENTS

| EP | 0 526 939 A1 | 10/1993 |
|---|---|---|
| JP | 11-191590 | 7/1999 |

* cited by examiner

*Primary Examiner*—George Fourson
*Assistant Examiner*—Suk-San Foong
(74) *Attorney, Agent, or Firm*—Morgan, Lewis & Bockius LLP

(57) ABSTRACT

A semiconductor device is disclosed, which can extend an effective channel length without changing layout. The semiconductor device includes a device barrier film formed in a semiconductor substrate, for defining an active region, a channel region formed in the semiconductor substrate at a variable depth and defined by removing some of the semiconductor substrate corresponding to the active region in a groove form, and a gate electrode formed on the semiconductor substrate with a gate insulating film interposed therebetween, a material of the gate electrode being covered with the gate insulating film.

6 Claims, 7 Drawing Sheets

SEMICONDUCTOR DEVICE AND METHOD FOR FABRICATING THE SAME

The present invention claims the benefit of Korean Patent Application No. P2000-44643 filed in Korea on Aug. 1, 2000, which is hereby incorporated by reference.

BACKGROUND OF THE INVENTION

1. Field of the Invention

The present invention relates to a semiconductor device, and more particularly, to a semiconductor device and a method for fabricating the same that can extend an effective channel length without changing layout.

2. Background of the Related Art

Recently, with increase of packing density of a semiconductor device, the number of cells required in the same area increases and the size of a unit device decreases. As a result, a short channel effect is enhanced and roll-off of a threshold voltage increases, so that it is difficult to control device characteristic in mass production of the product.

A related art semiconductor device and a method for fabricating the same will be explained with reference of the accompanying drawings.

FIG. 1A to FIG. 1E are sectional views illustrating fabricating process steps of a related art semiconductor device.

Figure 1A:
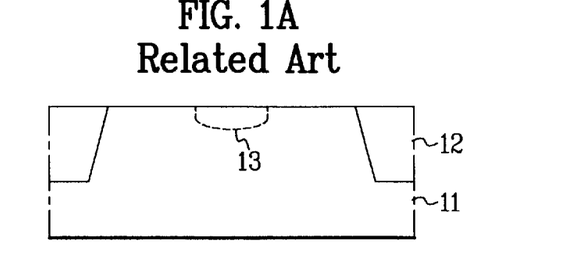
FIG. 1A to FIG. 1E are sectional views illustrating fabricating process steps of a related art semiconductor device.
Figure 1B:
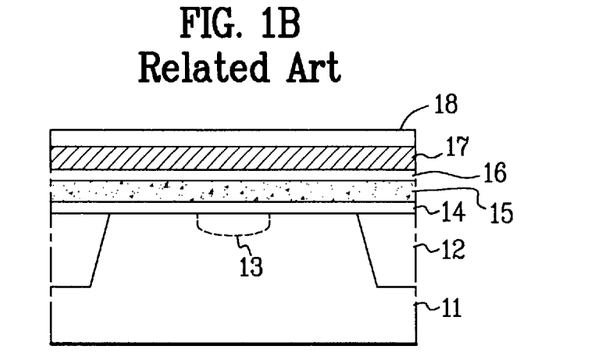
Figure 1C:
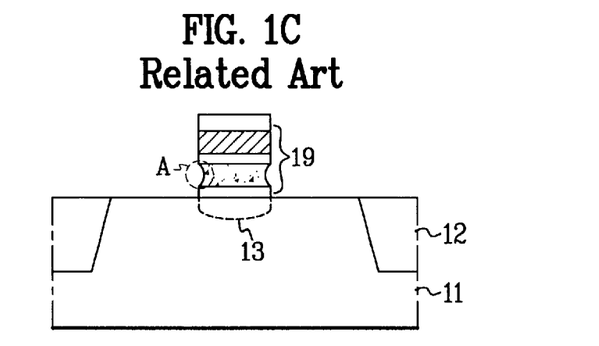
Figure 1D:
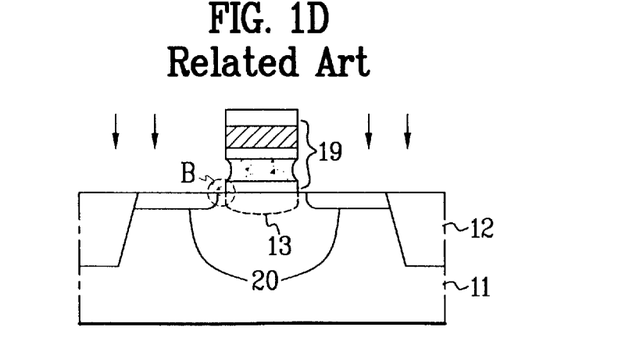
Figure 1E:
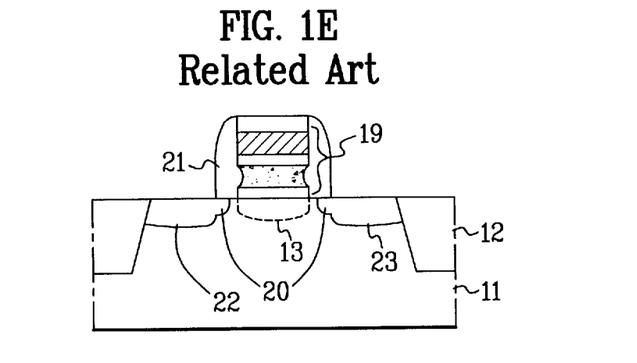

As shown in FIG. 1E, a related art semiconductor device includes a field oxide film 12 formed in a semiconductor substrate 11, for defining a field region and an active region, a gate 19 formed by sequentially depositing a gate oxide film 14, an amorphous silicon film 15, a diffusion barrier film 16, a metal film 17 and a mask film 18 on one region of the semiconductor substrate 11, a channel region 13 formed in the semiconductor substrate 11 below the gate 19, a lightly doped drain (LDD) region 20 formed in the semiconductor substrate at both sides of the gate 19, insulating film sidewalls 21 formed at both sides of the gate 19, and source and drain regions 22 and 23 formed in the semiconductor substrate 11 at both sides of the insulating film sidewalls 21.

A related art method for fabricating the semiconductor device will now be described.

As shown in FIG. 1A, a field oxide film 12 is formed in a semiconductor substrate 11 by a shallow trench isolation (STI) process to define a field region and an active region.

A channel ion is injected into the semiconductor substrate 11 using a mask to partially expose the semiconductor substrate 11 corresponding to the active region. The channel region 13 is then formed in the exposed semiconductor substrate at a predetermined depth.

As shown in FIG. 1B, the gate oxide film 14 is formed on an entire surface of the semiconductor substrate 11. The amorphous silicon film 15, the diffusion barrier film 16, the metal film 17 and the mask film 18 are sequentially deposited on the gate oxide film 14.

As shown in FIG. 1C, the mask film 18, the metal film 17, the diffusion barrier film 16, the amorphous silicon film 15, and the gate oxide film 14 are selectively removed by photolithography and etching processes to remain on the channel region 13 and the semiconductor substrate 11 adjacent to the channel region 13, so that the gate 19 is formed.

As shown in a portion 'A' of FIG. 1C, in the etching process, undercut occurs, in which both sides of the amorphous silicon film 15 are excessively etched. For this reason, an effective channel length of the lower parts decreases.

Also, the gate 19 having a multilayered structure consisting of the gate oxide film 14, the amorphous silicon film 15, the diffusion barrier film 16, the metal film 17, and the mask film 18 has high aspect ratio so that the semiconductor substrate 11 close to the gate 19 is shaded by the gate 19.

As shown in FIG. 1D, lightly doped impurity ions are injected into the entire surface of the semiconductor substrate 11 using the gate 19 as a mask. Therefore, the LDD region 22 is formed in the semiconductor substrate 11 at both sides of the gate 19 at a predetermined depth.

At this time, the gate 19 and the LDD region 20 do not overlap each other as shown in a portion 'B' of FIG. 1D. This is because that the ions are not injected into the semiconductor substrate 11 at both sides of the gate 19 shaded by the gate 19 having high aspect ratio.

As shown in FIG. 1E, a nitride film is deposited on the entire surface of the semiconductor substrate 11 including the gate 19, and then etched back to remain at both sides of the gate 19, so that the insulating film sidewalls 21 are formed.

Subsequently, heavily doped impurity ions are injected into the entire surface of the semiconductor substrate 11 using the gate 19 and the insulating film sidewalls 21 as masks so that the source and drain regions 22 and 23 are formed in the semiconductor substrate 11 at both sides of the insulating film sidewalls 21 at a predetermined depth. Thus, the related art semiconductor substrate is completed.

However, the related art semiconductor device and the method for fabricating the same have several problems.

Since undercut occurs in the amorphous silicon film during the patterning process of the gate, the effective channel length decreases. For this reason, short channel effect is enhanced, thereby degrading the characteristic of a semiconductor device.

Furthermore, the source region and the drain region are not overlapped each other as a dopant is not injected into the region shaded by the gate having high aspect ratio. As a result, the semiconductor device has a serious defect.

Finally, a defect like floating of a wordline occurs as the gate exposed to the air is oxidized, so that the characteristic of a semiconductor device is degraded.

SUMMARY OF THE INVENTION

Accordingly, the present invention is directed to a semiconductor device and a method for fabricating the same that substantially obviates one or more problems due to limitations and disadvantages of the related art.

An object of the present invention is to provide a semiconductor device and a method for fabricating the same that extends an effective channel length and prevents a gate from being oxidized, thereby improving reliability of the device and production yield and increasing packing density.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a semiconductor device includes a device barrier film formed in a semiconductor substrate, for defining an active region, a channel region formed in the semiconductor substrate at a variable depth and defined by removing some of the semiconductor substrate corresponding to the active region in a groove form, and a gate electrode formed on the semiconductor substrate with a gate insulating film interposed therebetween, a material of the gate electrode being covered with the gate insulating film.

In another aspect of the present invention, a manufacturing method of the semiconductor device includes the steps of forming a device barrier film in a semiconductor substrate which defines an active region, depositing a conductive film on an entire surface of the semiconductor substrate, forming a trench by removing a conductive film to partially expose the semiconductor substrate in the active region, defining a channel region by removing the exposed semiconductor substrate in a groove form, forming a gate insulating film on surface of the semiconductor substrate including the trench, burying the semiconductor film and the cap insulating film in the trench, removing the gate insulating film formed on the conductive film, removing the conductive film to form a gate consisting the gate insulating film, the semiconductor film and the cap insulating film.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

FIG. 2A to FIG. 2G are sectional views illustrating fabricating process steps of a semiconductor device in accordance with a first preferred embodiment of the present invention.

Figure 2A:
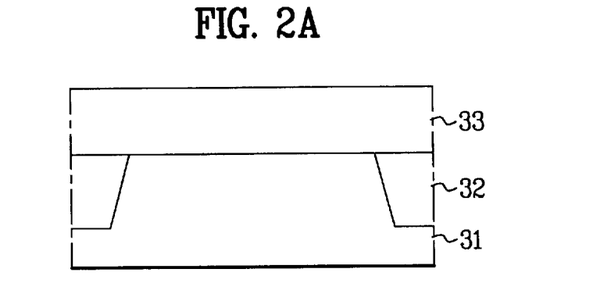
FIG. 2A to FIG. 2G are sectional views illustrating fabricating process steps of a semiconductor device in accordance with a first preferred embodiment of the present invention.
Figure 2B:
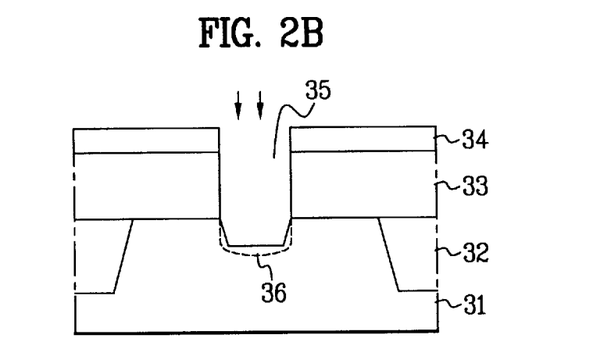
Figure 2C:
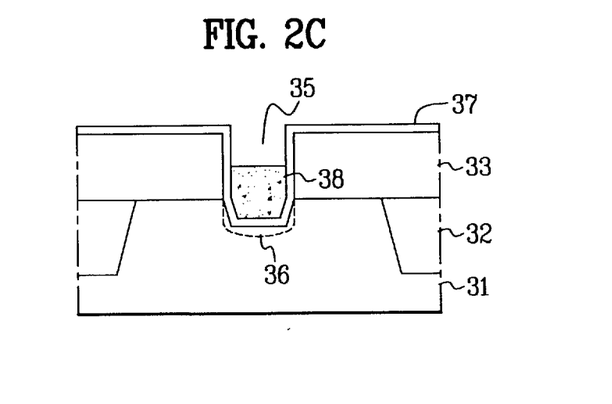
Figure 2D:
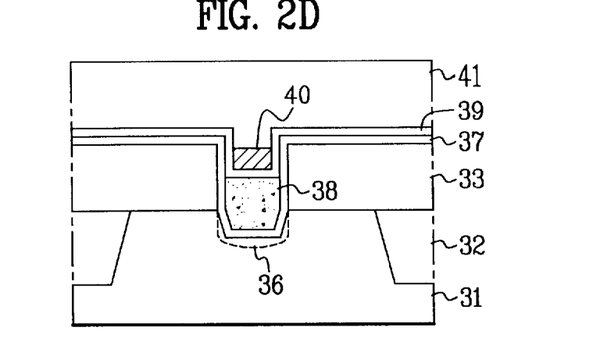
Figure 2E:
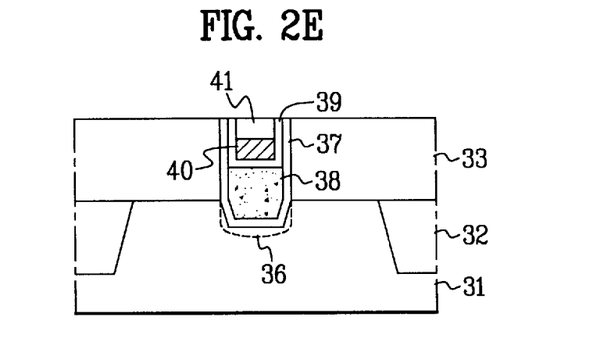
Figure 2F:
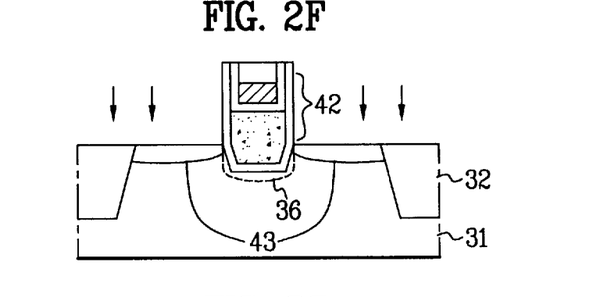
Figure 2G:
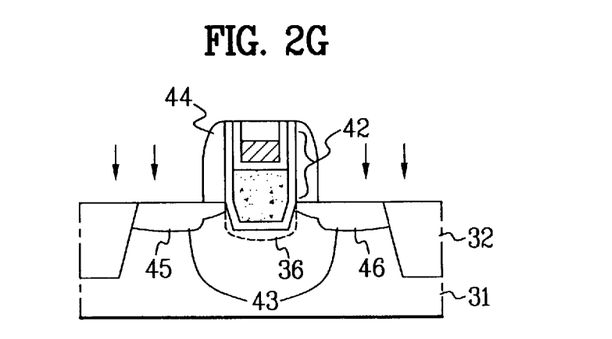
Figure 3A:
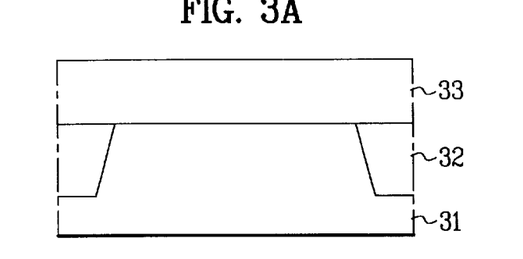
FIG. 3A to FIG. 3H are sectional views illustrating fabricating process steps of a semiconductor device in accordance with a second preferred embodiment of the present invention.
Figure 3B:
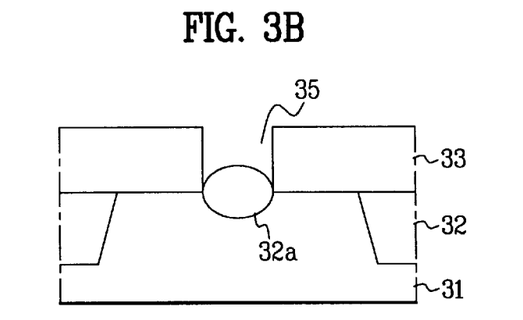
Figure 3C:
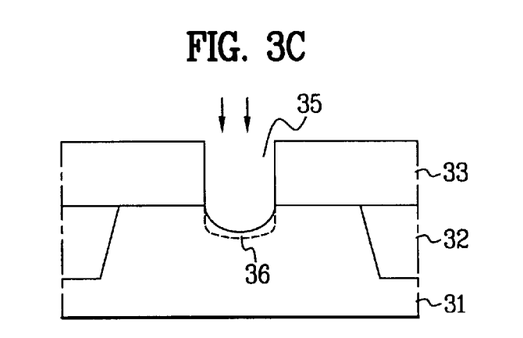
Figure 3D:
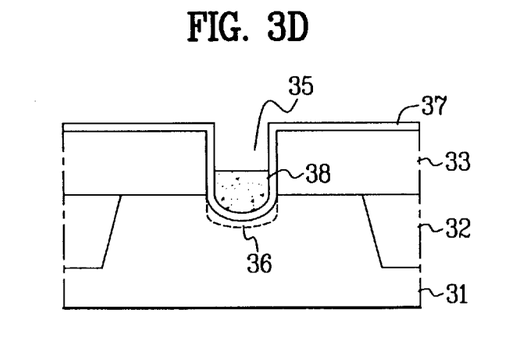
Figure 3E:
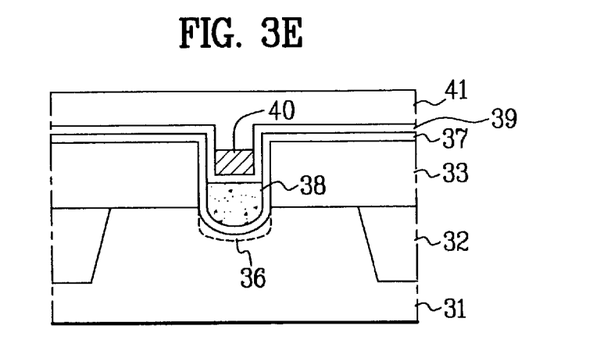
Figure 3F:
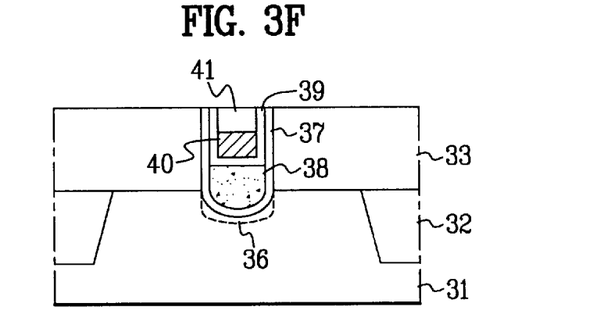
Figure 3G:
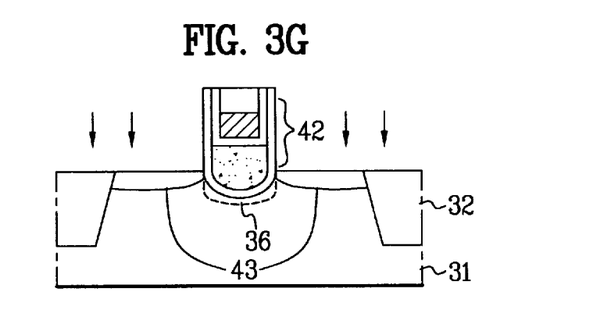
Figure 3H:
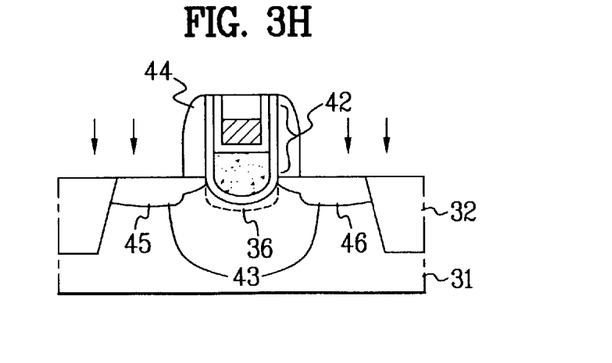

As shown in FIG. 2G, a field oxide film 32 is formed in a predetermined region of a semiconductor substrate 31. An active region and a field region are defined by the field oxide film 32. Then, a channel region is defined by removing some of the semiconductor substrate 31 corresponding to the active region in a groove form.

The channel region 36 is formed in the semiconductor substrate 31 at a predetermined depth, and in turn a cylinder-shaped gate insulating film 37 is formed on the semiconductor substrate 31 in which the channel region 36 is formed.

An amorphous silicon film 38 is formed below the cylinder-shaped gate insulating film 37 at a constant height, and a cylinder-shaped diffusion barrier film 39 is formed along surfaces of the amorphous silicon film 38 and the gate insulating film 37.

A metal film 40 and a mask film 41 are sequentially deposited to fill up the inner parts of the cylinder-shaped diffusion barrier film. Thus, a gate consisting of the gate insulating film 37, the amorphous silicon film 38, the diffusion barrier film 39, the metal film 40 and the mask film 41 is formed.

Herein, the gate 42 has a dual gate structure, which includes an amorphous silicon film 38 and a metal film 40. The amorphous silicon film 38 and the metal film 40 are insulated from each other by the diffusion barrier film 39, and are perfectly covered with the gate insulating film 37 and the mask film 41 so that the gate material is prevented from being exposed to the air and being oxidized.

An LDD region 43 is formed in the semiconductor substrate 31 at both sides of the gate 42, and insulating film sidewalls 44 are formed at both sides of the gate 42.

A source region 45 and a drain region 46 are formed in the semiconductor substrate 31 at both sides of the insulating film sidewalls 44 at a predetermined depth.

A method for fabricating the aforementioned semiconductor device according to the first embodiment of the present invention will now be described.

As shown in FIG. 2A, the field oxide film 32 is formed in the semiconductor substrate 31 by an STI process to define the field region and the active region.

A first polysilicon film 33 is then deposited on the entire surface of the semiconductor substrate 31.

As shown in FIG. 2B, a photoresist 34 is deposited on the entire surface of the first polysilicon film 33, and the photoresist 34 is patterned by exposure and developing processes to expose some of the first polysilicon film 33.

The exposed first polysilicon film 33 is removed using the patterned photoresist 34 as a mask to form a trench 35. Then, a channel region 36 is defined by etching the semiconductor substrate 31 below the trench 35 in the groove form.

The channel region 36 is formed in the semiconductor substrate etched in the groove form at a predetermined depth by injecting channel ions into the semiconductor substrate using the patterned photoresist 34 as a mask. The photoresist 34 is then removed.

As shown in FIG. 2C, a gate insulating film 37 is formed on the entire surface of the semiconductor substrate 31 including the trench 35. Then, the amorphous silicon film 38 is deposited on the gate insulating film 37 by a chemical vapor deposition (CVD) process and then blanket-etched, to remain on the gate insulating film 37 below the trench 35.

Herein, the gate insulating film 37 is formed by growing an oxide film, or by depositing oxide, nitride or oxynitride by the CVD process. Alternatively, the gate insulating film 37 may be formed by depositing nitride or oxynitride on an oxide film through a later process such as plasma treatment, heat treatment, and ions implantation after growing the oxide film.

As shown in FIG. 2D, the diffusion barrier film 39 and the metal film 40 are sequentially deposited on the entire surface of the semiconductor substrate 31 including the trench 35. The metal film 40 is blanket-etched to remain on the diffusion barrier film 39 below the trench 35. Then, the mask film 41 is deposited on the entire surface of the semiconductor substrate including the trench 35.

At this time, the diffusion barrier film 39 is formed of one of the nitride materials such as a tungsten nitride film and a silicon nitride film (SiNx). The metal film 40 is formed of one of refractory metals such as Tungsten (W), Titanium (Ti) and Molybdenum (Mo).

As shown in FIG. 2E, the mask film 41, the diffusion barrier film 39 and the gate insulating film 38 are removed by a chemical mechanical polishing (CMP) process to expose an upper part of the first polysilicon film 33.

As shown in FIG. 2F, the first polysilicon film 33 is removed to form the gate 42 consisting of the gate insulating film 37, the amorphous silicon film 38, the diffusion barrier film 40 and the mask film 41.

The LDD region 43 is formed in the semiconductor substrate 41 at both sides of the gate 42 by implanting lightly doped impurity ions into the semiconductor substrate. At this time, the gate 42 is used as a mask.

As shown in FIG. 2G, an insulating film is deposited on the entire surface of the semiconductor substrate 31, and then etched back to remain at both sides of the gate 42, so that insulating film sidewalls 44 are formed.

Herein, the insulating film is formed by depositing an oxide film or a nitride film, or by depositing a nitride film on an oxide film after depositing the oxide film, or is formed by depositing an oxide film on a nitride film after depositing the nitride film.

Subsequently, heavily doped impurity ions are injected into the entire surface of the semiconductor substrate 11 using the gate 42 and the insulating film sidewalls 44 as masks so that the source and drain regions 45 and 46 are formed in the semiconductor substrate 31 at both side of the insulating film sidewalls 44 at a predetermined depth. Thus, the semiconductor device according to the first embodiment of the present invention is completed.

The structure of a semiconductor device in accordance with the second embodiment of the present invention is the same with the first embodiment of the present invention. A method for fabricating the semiconductor device according to the second embodiment of the present invention will be described with reference to FIG. 3A to FIG. 3H. As shown in FIG. 3A to FIG. 3H, a filed oxide film 32 is formed in a semiconductor substrate 31 to define a field region and an active region.

A first poly silicon film 33 is deposited on the entire surface of the semiconductor substrate 31, and then removed to expose one region of the semiconductor substrate 31 of the active region, so that a trench 35 is formed. Then, an oxide film 32a is grown on the exposed semiconductor substrate 31 by the thermal oxidation process.

At this time, the oxide film 32a is formed not only in the upper part of the exposed semiconductor substrate 31 but also in the inner part of the semiconductor substrate 31 in a groove form.

The oxide film 32a is then removed to define a channel region 36 in the semiconductor substrate 31.

The later process will be omitted because it is the same with the process in accordance with the first embodiment of the present invention.

Figure 4A:
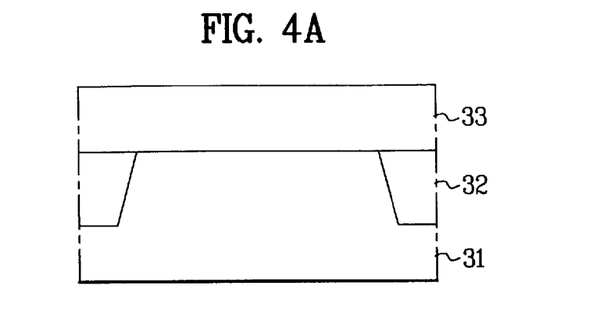
FIG. 4A to FIG. 4D are sectional views illustrating fabricating process steps of a semiconductor device in accordance with a third preferred embodiment of the present invention.
Figure 4B:
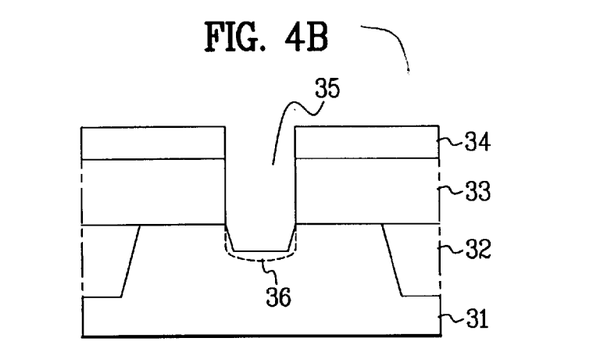
Figure 4C:
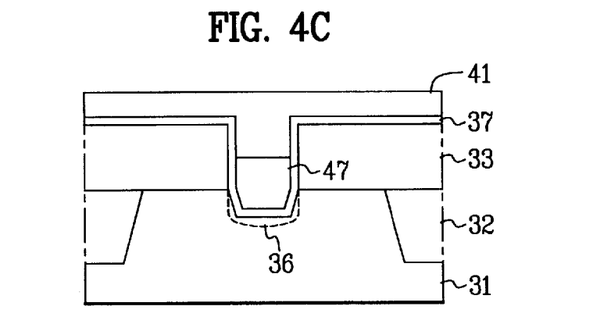
Figure 4D:
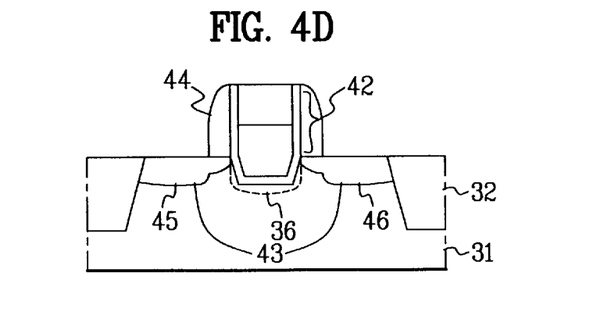

As shown in FIG. 4D, a semiconductor device in accordance with the third embodiment of the present invention has a single gate structure.

That is, a gate 42 of the semiconductor device according to the first embodiment of the present invention has a dual gate structure, which includes an amorphous silicon film 38 and a metal film 40. In the first embodiment, the amorphous silicon film 38 and the metal film 40 are insulated each other by the diffusion barrier film 39, and the gate materials are perfectly covered with the gate insulating film 37 and the mask film 41.

Meanwhile, a gate 42 in accordance with the third embodiment of the present has a single gate structure, which includes a second poly-silicon film 47. In the third embodiment, the second poly-silicon film 47 is perfectly covered with a gate insulating film 37 and a mask film 41.

Figure 5A:
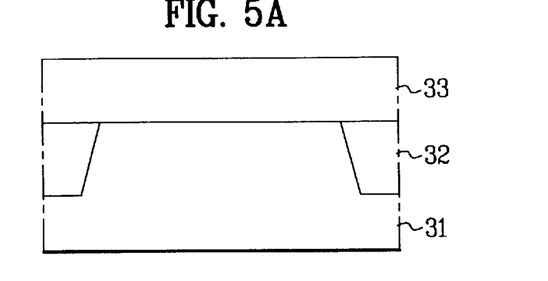
FIG. 5A to FIG. 5D are sectional views illustrating fabricating process steps of a semiconductor device in accordance with a fourth preferred embodiment of the present invention.
Figure 5B:
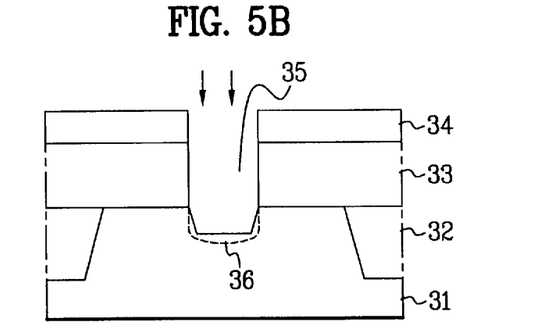
Figure 5C:
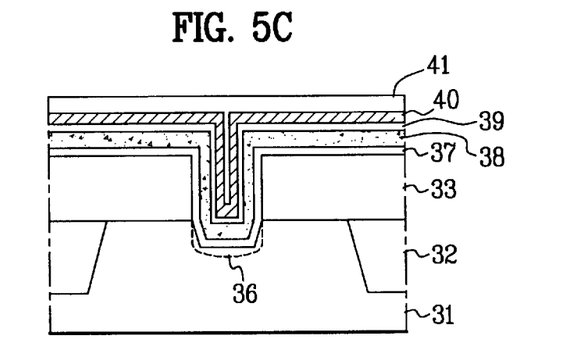

A method for fabricating a semiconductor device in accordance with the fourth embodiment of the present invention will be explained with reference to FIG. 5A to FIG. 5.

In the method for fabricating a semiconductor device in accordance with the first embodiment of the present invention, the gate 42 is formed by respectively depositing the amorphous silicon film 48 and the metal film 40 and blanket etching then to remain in the lower parts of the gate insulation film 37 or the diffusion barrier film 39.

However, in the fourth embodiment of the present invention, the gate 42 is formed without blanket-etching the amorphous silicon film 38 and the metal film 40.

That is, the gate insulation film 37, the amorphous silicon film 38, the diffusion barrier film 39, the metal film 40 and the mask film 41 are sequentially deposited on the semiconductor substrate 31 provided with the channel region 36 and on the first poly silicon film 33. The mask film 41, the metal film 40, the diffusion barrier film 39, the amorphous silicon film 38, and the gate insulating film 37 are removed by the CMP process to expose the first poly-silicon film 33. Then, the first poly-silicon film 33 is removed to form the gate 42.

Figure 5D:
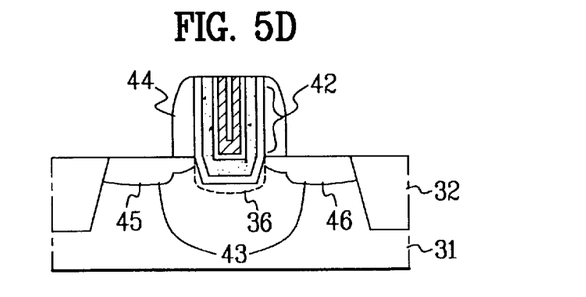

Accordingly, as shown in FIG. 5D, the gate has a layered structure on the semiconductor substrate 31 provided with the trench 35. The layered structure of the gate 42 includes the cylinder-shaped gate insulating film 37, the amorphous silicon film 38, the diffusion barrier film 39, the metal film 40, and the mask film 41 formed by burying a hollow portion of the cylinder-shaped metal film 40.

The other structure will be omitted because it is the same with the structure of the semiconductor device in accordance with the first embodiment of the present invention.

As has been explained, the semiconductor device and the method for fabricating the same according to the present invention have the following advantages.

First, since the lower structure of the gate is formed in a groove form to effectively extend an effective channel length without changing layout, packing density can be increased, thereby obtaining a stable and reliable semiconductor device.

Also, since the effective channel length can effectively be extended by preventing undercut of the poly-silicon film from occurring, so that a more reliable semiconductor device can be obtained.

Furthermore, since the size of the source and drain regions according to the lower pattern of the gate can exactly be adjusted, reliability of the semiconductor device can be improved.

Finally, since the gate is completely covered with the insulating film, it is possible to prevent the gate from being oxidized and a defect like floating of a wordline from occurring, thereby improving reliability of the semiconductor device.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method for fabricating a semiconductor device comprising the steps of:
    forming a device barrier film in a semiconductor substrate, which defines an active region;
    depositing a conductive film on an entire surface of the semiconductor substrate;
    forming a trench by removing a portion of the conductive film to partially expose the semiconductor substrate in the active region;
    defining a channel region by removing the exposed semiconductor substrate in a groove form by etching the exposed semiconductor substrate;
    forming a gate insulation film on a surface of the semiconductor substrate including the trench;
    forming an interleaving insulating film on the entire surface including the semiconductor film;
    forming a metal film on the interleaving insulating film including the trench;
    forming a cap insulating film on the metal film within the trench;
    burying a semiconductor film and the cap insulating film in the trench;
    removing the gate insulating film on the conductive film; and
    removing the resulting exposed portion of the conductive film to form a gate consisting of the gate insulating film, the semiconductor film, and the cap insulating film.

2. The method of claim 1, further comprising the step of etching back the semiconductor film on the interleaving insulating film to remain within the trench.

3. The method of claim 1, wherein, prior to the step of forming the trench, depositing a layer of photoresist over the entire surface of the conductive film, then exposing and developing a portion of the photoresist, thereby exposing a portion of the conductive film as a mask.

4. The method of claim 1, wherein, after the step of forming the trench and before the step of defining the channel region, forming an oxide film in the semiconductor substrate at a bottom of the trench by a thermal oxidation process using as a mask the conductive film which exposes some of the semiconductor substrate at the bottom of the trench, and then removing the oxide film.

5. The method of claim 1, wherein the semiconductor film is etched-back to remain in lower parts of the trench after forming the semiconductor film on the gate insulating film.

6. The method of claim 1, further comprising the steps of:
    forming an LDD region in the semiconductor substrate at both sides of the gate;
    forming insulating film sidewalls at both sides of the gate; and
    forming source and drain regions in the semiconductor substrate at both sides of the insulating film sidewalls.

* * * * *